United States Patent
Wu

(10) Patent No.: US 8,070,146 B2
(45) Date of Patent: Dec. 6, 2011

(54) SUPPORT DEVICE FOR SPUTTERING MACHINE

(75) Inventor: Chia-Ying Wu, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 421 days.

(21) Appl. No.: 12/476,122

(22) Filed: Jun. 1, 2009

(65) Prior Publication Data
US 2009/0295054 A1 Dec. 3, 2009

(30) Foreign Application Priority Data
Jun. 3, 2008 (CN) .......................... 2008 1 0301941

(51) Int. Cl.
*B23Q 1/00* (2006.01)
*C23C 14/34* (2006.01)
*C25B 9/00* (2006.01)
(52) U.S. Cl. ..................................... 269/56; 204/298.27
(58) Field of Classification Search .................. 269/56; 204/298.23, 298.27, 298.28
See application file for complete search history.

(56) References Cited

U.S. PATENT DOCUMENTS

| 5,662,785 A | * | 9/1997 | Schertler | 204/298.25 |
| 6,740,209 B2 | * | 5/2004 | Shibamoto et al. | 204/192.12 |
| 6,911,671 B2 | * | 6/2005 | Marcus et al. | 257/79 |
| 2005/0139467 A1 | * | 6/2005 | Takahashi | 204/298.23 |

* cited by examiner

*Primary Examiner* — David B Thomas
(74) *Attorney, Agent, or Firm* — Altis Law Group, Inc.

(57) ABSTRACT

A support device used in sputtering machine includes a chamber housing, a frame, at least one holding device, a first and second driving assemblies. The frame is rotatably mounted in the chamber housing. The holding device is rotatably mounted on the frame. The first driving assembly is received in the chamber housing and includes a first motor mounted on the chamber housing and a first shaft installed on the first motor. The first driving assembly is configured for driving the frame rotating in a plane by the first shaft. The second driving assembly is received in the chamber housing and includes a second motor mounted on the chamber housing and second shaft installed on the second motor. The second shaft adjacently parallels to the first shaft. The second driving assembly is configured for driving the at least one holding device rotating in a plane perpendicular to the rotating plane of the frame.

14 Claims, 3 Drawing Sheets

SUPPORT DEVICE FOR SPUTTERING MACHINE

BACKGROUND

1. Technical Field

The disclosure relates to support devices and, more particularly, to an supporting device for use in a sputtering machine.

2. Description of the Related Art

In the process of sputtering, work-pieces generally are hung/supported by a support device in a sealed vacuum processing chamber. To evenly deposit the ions of a target on the surfaces of work-pieces in the sputtering process, the work-pieces need to be rotated/turned over to the surfaces to be coated/processed are done. However, the rotating needs to be done manually, which means opening the vacuum seal and is time consuming and inefficient.

Therefore, what is needed is to provide a support device which can eliminate or at least alleviate the above problem.

DETAILED DESCRIPTION

Figure 1:
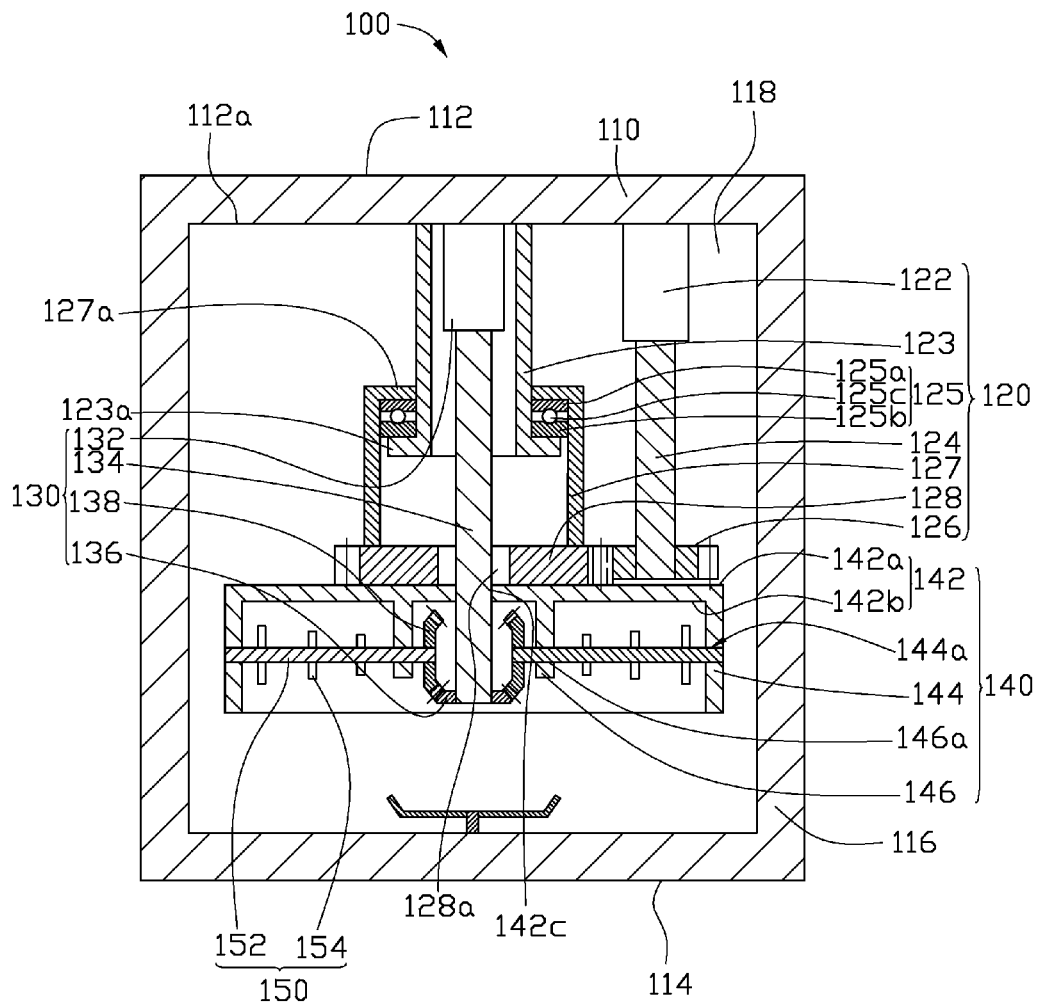
FIG. 1 is a cross-sectional view of a support device according to an exemplary embodiment.

Referring to FIG. 1, the support device 100 according to an exemplary embodiment includes a chamber housing 110, which accommodates a first driving assembly 120, a second driving assembly 130, a frame 140, and a number of holding devices 150. The first and second driving assemblies 120, 130 are separately mounted in the chamber housing 110. The frame 140 is rotatably mounted in the chamber housing 110 adjacent to the first and second driving assemblies 120, 130, and meshed with the first driving assembly 120. The holding devices 150 are rotatably mounted on the frame 140 and meshed with the second driving assembly 130.

The chamber housing 110 includes a top plate 112, a bottom plate 114 and a wall 116 perpendicularly interconnected between the top plate 112 and the bottom plate 114. The top plate 112 includes a mounting surface 112a. The top plate 112, bottom plate 114, and the side wall 116 cooperatively define a sealed chamber 118, which accommodates the first and second driving assemblies 120, 130, the frame 140, and the number of holding devices 150 and is suitable for carrying out the sputtering process. The chamber housing 110 can be evacuated by a suitable vacuum pumping and can be back-filled with a suitable gas, such as argon.

The first driving assembly 120 is received in the chamber housing 110 and includes a first motor 122, a first shaft 124, a driving gear 126, a follower gear 128, a first connecting tube 123, a bearing 125, and a second connecting tube 127. The first motor 122 is mounted on a mounting surface 112a of the top plate 112 of the chamber housing 110 and is configured for driving the first shaft 124, the driving gear 126, the follower gear 128, and the second connecting tube 127 to rotate. The first shaft 124 is drivably installed to the first motor 122. The first connecting tube 123 is mounted on the mounting surface 112a of the top plate 112 by an end thereof and parallel with the first shaft 124. The first connecting tube 123 is a hollow barrel and includes a first bearing flange 123a radially extending from an end of the first connecting tube 123 away from the mounting surface 112a of the top plate 112. The thrust bearing 125 is fitted on an end of the first connecting tube 123 distal from the mounting surface 112a of the top plate 112 and mounted on the first bearing flange 123a. The thrust bearing 125 includes an upper ring 125a, a lower ring 125b supported by the first bearing flange 123a, and a number of balls 125c contained by the upper and lower rings 125a, 125b and capable of running along a race defined between the upper and lower rings 125a, 125b. The driving gear 126 is mounted on an end of the first shaft 124 distal from the mounting surface of the top plate. The second connecting tube 127 similar to the first connecting tube 123 includes a second bearing flange 127a inwardly extending from an end of the second connecting tube 127 thereby the second connecting tube 127 can be rotatably hung on the upper ring 125a of the thrust bearing 125. The follower gear 128 is mounted on an end of the second connecting tube distal the thrust gearing meshed with the driving gear 126. The follower gear 128 defines a through hole 128a in a center thereof for portion of the second driving assembly 130 passing there-through to rotate the holding devices 150.

Alternatively, the first connecting tube 123 can be constructed by a plurality of ribs which are mounted on the mounting surface 112a of the top plate 112 and arranged equiangularly, and each of the ribs includes a protrusion perpendicularly protruding cooperatively from an end of the rib away from the top plate 112 forming a bearing support together with other protrusions, to serve as the first bearing flange 123a to support the bearing 125. Similarly, the second connecting tube 127 cab also be constructed by a plurality of ribs which are mounted on the upper ring 125a of the bearing 125 and arranged equiangularly, and each of the ribs includes a protrusion perpendicularly protruding from an end of the rib adjacent to the first connecting tube 123 cooperatively to form a holing flange together with other protrusions, to serve as the second bearing flange 127a to be hung on the bearing 125.

The second driving assembly 130 is received in the chamber housing 110 and includes a second motor 132, a second shaft 134, a driving bevel gear 136, a number of follower bevel gear 138. The second motor 132 is mounted on the mounting surface 112a of the top plate 112 of the chamber housing 110, and is surrounded by the hollow first connecting tube 123. The second shaft 134 is installed to the second motor 132 and extends through the first connecting tube 123, the thrust bearing 125, the second connecting tube 127 and the through hole 128a of the follower gear 118. The driving bevel gear 136 is mounted on an end of the second shaft 134 distal from the mounting surface of the top plate. The follower bevel gears 138 are mounted on the holding devices 150 and meshed to the driving bevel gear 138.

The frame 140 includes a connecting plate 142 having an upper surface 142a and an opposite lower surface 142b, an outer wall 144 formed on the lower surface 142b at the edge portion thereof, and an inner wall 146 extending from the connecting plate 142 at the lower surface 142b and parallel to the outer wall 144. The frame 140 is mounted on the follower gear 118 by the upper surface 142a of the connecting plate 142. The connecting plate 142 defines a center hole 142c at the center thereof coaxial with the inner wall 146 and running through the upper and lower surfaces 142a, 142b for the second shaft 134 passing there-through. The outer wall 144 and the inner wall 146 define a number pair of shaft holes 144a, 146a therein for rotatably supporting the holding devices 150.

Each of the holding device 150 includes a spindle 152 rotatably positioned into the shaft holes 144a, 146a, and at least one supporting bar 154 perpendicularly mounted on the spindle 152. The at least one supporting bar 154 is mounted on the spindle 152 by a center portion thereof. An end of the spindle 152 adjacent to the inner wall 146 extends through the inner wall 146 towards the center of the connecting plate 142 and supports the follower bevel gear 138 thereon.

Figure 2:
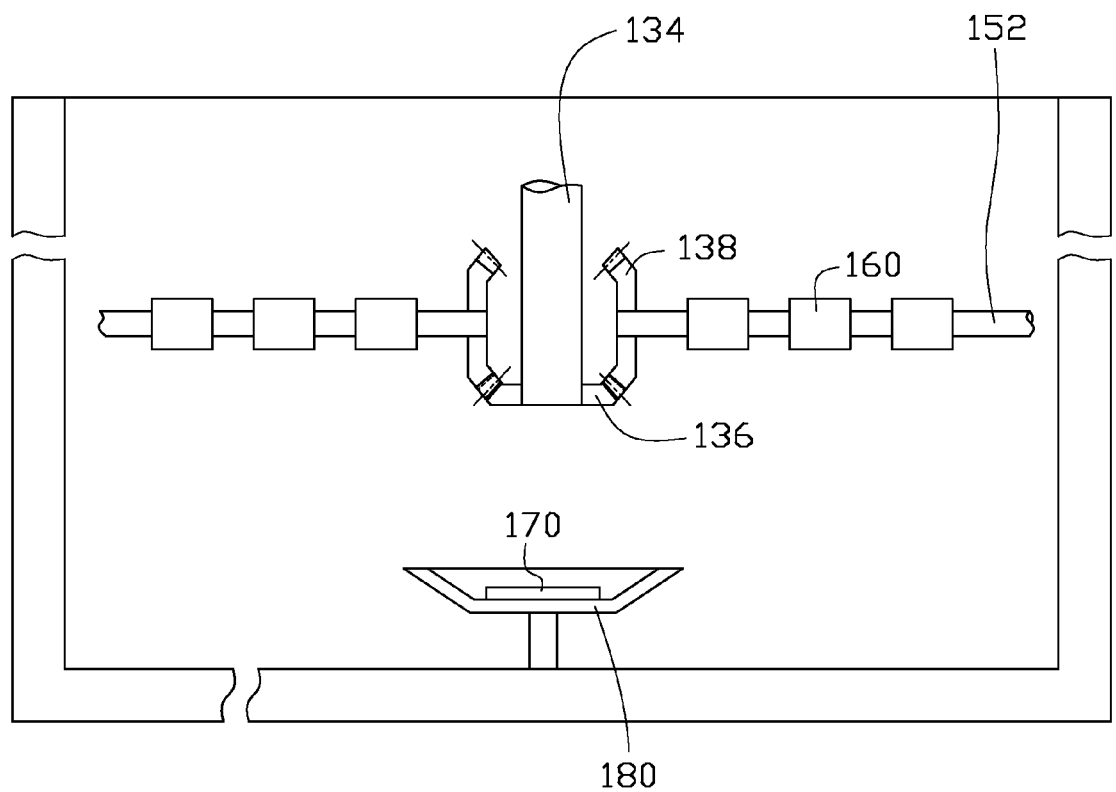
FIGS. 2 and 3 illustrate the movements of the support device shown in FIG. 1.
Figure 3:
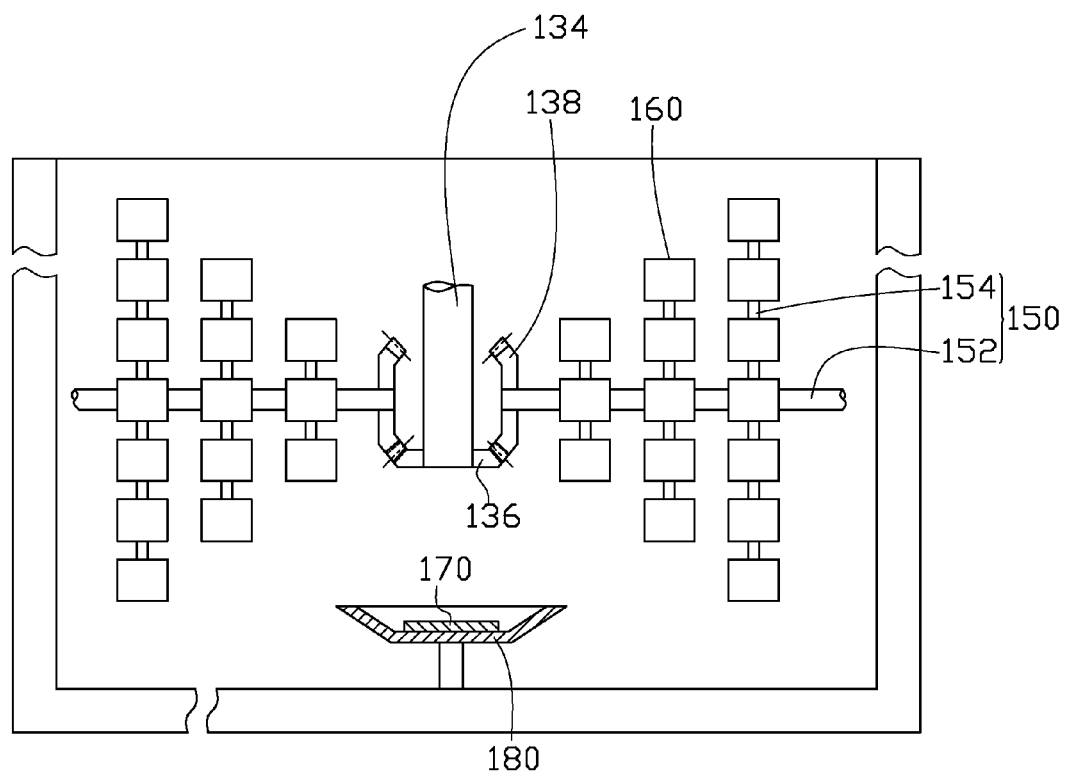

Referring to FIGS. 1 to 3, in use, work-pieces 160 are loaded on the holding device 150 of the support device 100. The chamber housing 110 is evacuated by suitable vacuum pumping and forms a suitable atmosphere for sputtering the work-pieces 160. A target 170 is positioned below the work-pieces 160 by a tray 180. A beam of argon plasma is applied to bombard the target 170 and eject the atoms/ions of the target 170 into the chamber 118 of the chamber housing 110. The sputtered atoms/ions in the chamber 118 tend to deposit on the surfaces of the work-pieces 160 in the chamber 118. Once the work pieces are coated on facing sides they are turned over and rotated for others surface to be coated. In the turning operation of the work-pieces 160 the first driving assembly 110 is controlled by operator to drive the frame 140 and the holding devices 150 rotating relative to a first axis, and the second driving assembly 120 is controlled to drive the holding devices 150 to rotate relative to a second axis perpendicular to the first axis. As a result, the work-pieces 160 can be turned over and rotated mechanically by the first and driving assemblies 110, 120, without disrupting the vacuum of the chamber 118 and is timesaving and efficient compared with manual operation of turning over and rotating the work-pieces.

Alternatively, the frame 140 can be directly connected on the distal end of the second connecting tube 127 instead of using the follower gear 128 to connect the frame 140 and connecting tube 127. The outer wall 144 of the frame 140 can be shaped as a cylindrical barrel which has a tooth bar (not shown) formed on the outer circumference surface thereof and meshed with the driver gear 126. In this configuration, the follower gear 128 of the first driving assembly 120 can be omitted and substituted by the tooth bar directly formed on the outer circumference surface of the outer wall of the frame 140 for simplifying the support device 100.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A support device for a sputtering machine comprising:
a chamber housing comprising a top plate, a bottom plate and a side wall perpendicularly interconnected between the top and bottom plate, the top plate comprising a mounting surface, the top plate, the bottom plate and the side wall cooperatively forming a sealed chamber;
a frame rotatably mounted in the chamber housing;
at least one holding device rotatably mounted on the frame;
a first driving assembly received in the chamber housing and comprising a first motor mounted on the mounting surface of the top plate and a first shaft installed to the first motor, the first driving assembly being configured for driving the frame rotating about a first axis; and
a second driving assembly received in the chamber housing and comprising a second motor mounted on mounting surface of the top plate and a second shaft installed to the second motor, the second shaft being adjacent and parallel to the first shaft, the second driving assembly being configured for driving the at least one holding device rotating about a second axis perpendicular to the first axis.

2. The support device as claimed in claim 1, wherein the first driving assembly further comprises a driving gear mounted on the first shaft, a first connecting tube mounted on mounting surface of the top plate and surrounding the second motor, a thrust gearing fitted on an end of the first connecting tube distal from mounting surface of the top plate, a second connecting tube rotatably coupled to the first connecting tube via the thrust gearing, and a follower gear mounted on an end of the second connecting tube distal from the thrust gearing and meshed with the driving gear; the frame is mounted on the follower gear.

3. The support device as claimed in claim 2, wherein the frame comprises a connecting plate comprising an upper surface and a lower surface opposite to the upper surface and mounted on the follower gear by the upper surface, an outer wall formed on the lower surface at the edge portion, and an inner wall formed on the lower surface.

4. The support device as claimed in claim 3, wherein the follower gear defines a through hole in the center; the connecting plate defines a center hole therein; the second shaft extends through first connecting tube, the thrust bearing, the second connecting tube, the through hole of the follower gear and the center hole of the connecting plate; the second driving assembly further comprises a driving bevel gear mounted on an end of the second shaft distal from the mounting surface of the top plate, and a plurality of follower bevel gears mounted on the holding devices and meshed with the driving bevel gear.

5. The support device as claimed in claim 4, wherein the at least one holding device comprises a spindle and at least one supporting bar mounted on the spindle by a center portion of the supporting bar; the spindle of the at least one holding device is rotatably positioned between the inner and outer walls.

6. The support device as claimed in claim 5, wherein the inner and outer walls define a pair of shaft holes therein, the spindles of the at least one holding device are rotatably positioned into the shaft holes of the inner and outer walls.

7. The support device as claimed in claim 6, wherein an end of each spindle adjacent to the inner wall extends through the inner wall towards the center of the connecting plate and supports the follower bevel gear thereon.

8. The support device as in claim 2, wherein the first connecting tube is a hollow barrel and comprises a first bearing flange radially extending from the first connecting tube at an end away from the mounting surface of the top plate; the thrust bearing comprises an upper ring a lower ring mounted on the first bearing flange, and a number of balls contained by the upper and lower rings.

9. The support device as claimed in claim 8, wherein the second connecting tube comprises a second bearing flange extending inwardly from the second connecting tube at an end adjacent to the first connecting tube, the second bearing flange is mounted on the upper ring of the thrust bearing.

10. The support device as claimed in claim 2, wherein the first connecting tube is constructed by a plurality of ribs which are mounted on the mounting surface of the top plate and arranged equiangularly, and each of the ribs includes a protrusion perpendicularly protruding from an end of the rib away from the top plate cooperatively forming a bearing support together with other protrusions, to serve as the first bearing flange to support the thrust bearing.

11. The support device as claimed in claim 10, wherein the second connecting tube is constructed by a plurality of ribs which are positioned on upper ring of the bearing and arranged equiangularly, and each of the ribs includes a protrusion perpendicularly protruding from an end of the rib adjacent to the first connecting tube cooperatively forming a holing flange together with other protrusions, to serve as the second bearing flange to be hung on the bearing.

12. The support device as claimed in the claim 1, wherein the first driving assembly further comprises a driving gear mounted on an end of the first shaft distal from the first motor, a first connecting tube mounted on mounting surface of the top plate and surrounding the second motor, a thrust gearing fitted on an end of the first connecting tube distal from the mounting surface of the top plate, a second connecting tube sleeved the first connecting tube and mounted on the thrust gearing, the frame is mounted on the distal end of the second connecting tube.

13. The support device as claimed in claim 12, wherein the frame comprises a connecting plate comprising an upper surface mounted on the second connecting tube and lower surface opposite to the upper surface and an outer wall formed on the lower surface at the edge portion, and an inner wall formed on the lower surface.

14. The support device as claimed in claim 13, wherein the outer wall is a cylindrical barrel and comprises a tooth bar formed on the outer circumference surface thereof and meshed with the driver gear of the first driving assembly.

* * * * *